United States Patent [19]

Arai

[11] Patent Number: 5,389,808
[45] Date of Patent: Feb. 14, 1995

[54] NON-VOLATILE SEMICONDUCTOR MEMORY WITH INCREASED CAPACITANCE BETWEEN FLOATING AND CONTROL GATES

[75] Inventor: Norihisa Arai, Oomiya, Japan

[73] Assignee: Kabushiki Kaisha Toshiba, Kanagawa, Japan

[21] Appl. No.: 199,018

[22] Filed: Feb. 18, 1994

[30] Foreign Application Priority Data

Feb. 25, 1993 [JP] Japan .................................. 5-036528

[51] Int. Cl.6 ............................................ H01L 29/78
[52] U.S. Cl. ..................................... 257/316; 257/322
[58] Field of Search ............... 257/316, 318, 320, 322, 257/306, 317; 365/185, 218; 437/43, 49

[56] References Cited

U.S. PATENT DOCUMENTS

| | | | |
|---|---|---|---|
| 4,812,885 | 3/1989 | Riemenschneider | 257/316 |
| 4,833,514 | 5/1989 | Esquivel et al. | 257/316 |
| 5,021,848 | 6/1991 | Chiu | 257/317 |
| 5,268,318 | 12/1993 | Harari | 257/320 |
| 5,268,585 | 12/1993 | Yamauchi | 257/316 |

FOREIGN PATENT DOCUMENTS 3-34578  2/1991  Japan .

OTHER PUBLICATIONS

Mitchell et al., "A New Self-Aligned Planar Array Cell For Ultra High Density Eproms", pp. 538–551, Published in 1987.

*Primary Examiner*—Robert Limanek
*Attorney, Agent, or Firm*—Banner, Birch, McKee & Beckett

[57] ABSTRACT

In a semiconductor device, a first gate electrode and isolation layers are formed on a first gate insulation layer on a p-type silicon semiconductor substrate, and a second gate electrode is formed on the first gate electrode with a second gate insulation layer interposed therebetween. The first gate electrode is constituted by a first polycrystalline silicon layer, a second polycrystalline silicon layer and an etching stopper thin film interposed therebetween. The first gate electrode is formed by anisotropic-etching or selectively etching the second polycrystalline silicon layer, so that the etching stopper is maintained.

22 Claims, 6 Drawing Sheets

NON-VOLATILE SEMICONDUCTOR MEMORY WITH INCREASED CAPACITANCE BETWEEN FLOATING AND CONTROL GATES

BACKGROUND OF THE INVENTION

1. Field of the Invention

The present invention relates to a semiconductor device and a method for manufacturing the same, and more particularly to a semiconductor device, such as a non-volatile memory, in which two gate electrodes and an insulation layer interposed therebetween are used as a capacitor, and a method for manufacturing the same.

2. Description of the Related Art

In recent years, the demand for a technique for increasing the capacity and the operation speed of a semiconductor memory has become greater and greater. A nonvolatile memory, such as an EPROM or EEPROM, in which a structure consisting of first and second gate electrodes and an insulation layer interposed therebetween is used as a capacitor for storing data, is not an exception.

A conventional EPROM or EEPROM has a memory cell structure, in which one bit line contact is required for every two memory cells. Although development of the processing technique has allowed miniaturization of some elements of a memory cell, it is difficult, in general, to miniaturize a portion around a contact to the highest degree. This difficulty results from the fact that miniaturization in a lateral direction progresses in accordance with the development of photolithography techniques, whereas miniaturization in a vertical direction does not. In other words, it is difficult to reduce the depth of a contact hole or the aspect ratio. Rather, the depth of a contact hole becomes greater in accordance with the miniaturization in the lateral direction. More specifically, when a memory cell is reduced in size in the lateral direction, the substrate thereof has great ruggedness. The disparity in the surface level of the substrate causes a disconnection of an Al wiring layer. Since a thick passivation layer is used in general to prevent the disconnection defect, the contact hole must be inevitably deep.

On the other hand, when the size of a contact hole is reduced, the contact resistance is increased and the disparity in the surface level of the substrate is great at the contact hole, resulting in a disconnection defect of an Al wiring layer. To reduce the influence of the surface level disparity of the substrate, the contact hole must be relatively large, so that a large amount of Al wiring material can be introduced into the hole.

As described above, miniaturization of a contact hole has not progressed, but miniaturization of a contact is indispensable in forming a fine memory cell. In addition, since a number of contact holes are required in a semiconductor device (one contact hole for every two cells), reduction in the manufacturing yield or a defect in a product tend to occur easily due to the contact holes.

Figure 1A:
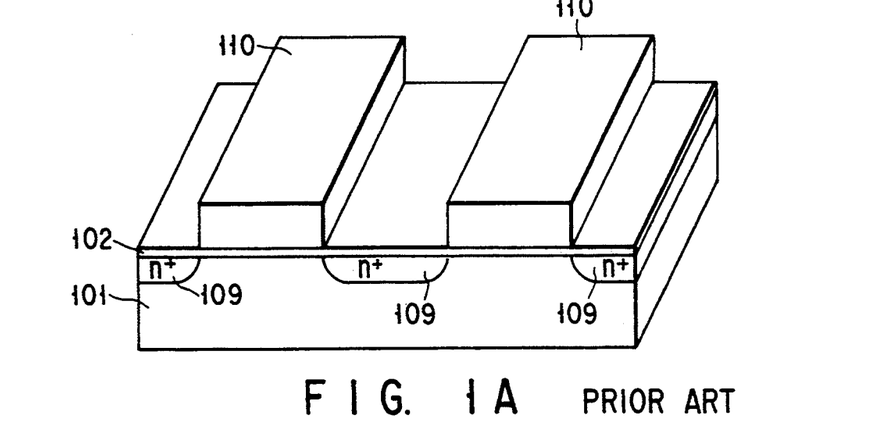
FIGS. 1A to 1C are diagrams showing the steps of manufacturing a conventional semiconductor device.
Figure 1B:
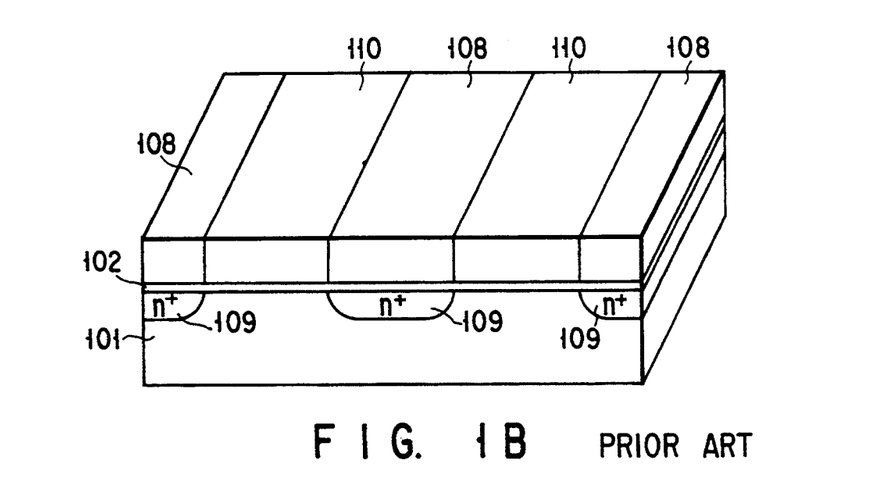
Figure 1C:
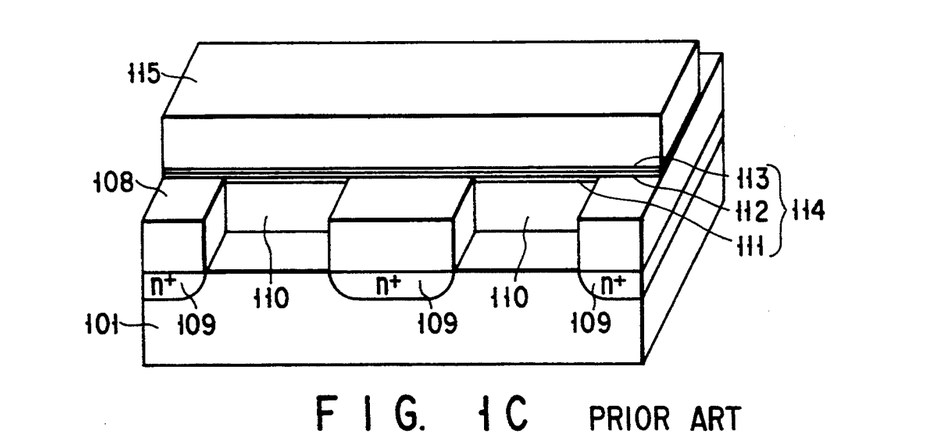

To overcome the above problems, a memory cell, of a type which does not require a bit line contact, has been proposed (IDEM, pages 548 to 551, 1987). FIGS. 1A to 1C are schematic diagrams showing the steps of manufacturing a memory cell of this type. First, as shown in FIG. 1A, a first gate insulation layer 102 and a plurality of first gate electrodes (floating gate electrodes) 110 are formed on a p-type silicon substrate 101. Then, an n-type impurity is introduced, using the first gate electrodes 110 as masks, to an exposed portion of a surface region of the p-type silicon substrate 101, thereby forming an n+ diffusion region 109. Subsequently, as shown in FIG. 1B, a thick silicon oxide layer 108 is formed on the first gate insulation layer 102, and interposed between the first gate electrodes 110.

Thereafter, as shown in FIG. 1C, a second gate insulation layer 114 is formed on the first gate electrodes 110. A second gate electrode (control gate electrode) 115 is formed on the second gate insulation layer 114. The second gate insulation layer 114 is formed of a composite layer consisting of a polycrystalline silicon oxide layer 111, a silicon nitride layer 112 and a silicon oxide layer 113.

In a memory cell as shown in FIG. 1C, the bit line (n+ diffusion region 109) is formed just under the silicon oxide layer 108 and the second gate electrode (control gate electrode) 115 extends in a direction perpendicular to the bit line. Thus, a contact is formed in a region in which the bit line and the word line cross each other. Such a structure is called a cross-point type memory cell.

Since the above memory cell does not require a bit line contact which is difficult to miniaturize, the size thereof can be reduced to at least half that of a memory cell having a bit line contact. Further, the size of a memory cell can be reduced simply in accordance with the progress in miniaturization techniques such as photolithography. Thus, the requirement for a large capacity can be satisfied.

However, an increase in the capacity of a semiconductor memory device is accompanied by the following drawbacks: a considerable period of time is required for inspection before delivery; and the manufacturing cost is increased. Therefore, it is practically very difficult to reduce the size of a memory cell simply by means of fine processing techniques, while increasing the integration density of the memory cell. In addition, since there is a great demand for a high speed operation, as well as for an increase in capacity, not only miniaturization of the memory cell but also high performance and a high operation speed are indispensable. With regard to an EPROM or EEPROM as shown in FIG. 1C, in which the first and the second gate electrodes 110 and 115 and the insulation layer 114 interposed therebetween are used as a capacitor, it is known that the inspection time can be reduced by high speed writing and the operation speed can be increased by a high channel current, if the capacitance of the gate insulation layer 114 is increased.

However, although the conventional nonvolatile memory device as shown in FIG. 1C is advantageous in miniaturization of the device, the capacitance between the first and the second gate electrodes 110 and 115 cannot be as high as is required for a memory cell, since the area of a region between the first and the second gate electrodes 110 and 115 (a coupling area) is limited to only the portion just above the channel of the memory cell. Also in a conventional memory cell of the type which requires a bit line contact, the region between first and second gate electrodes on an isolation oxide layer must be sufficiently large to secure a coupling area. This factor, in addition to the necessity for a bit line contact, limits the miniaturization of a memory cell. Jpn. Pat. Appln. Publication KOKAI No. 3-34578 discloses that the integration density of a memory cell which requires a bit line contact can be increased by increasing the coupling area.

The capacitance can also be increased by reducing the thickness of the second gate insulation layer 114. However, if the thickness is reduced, the gate breakdown voltage is lowered, resulting in reliability also being lowered. It is particularly notable in an EPROM or an EEPROM, since a high electrical field is applied to the gate insulation layer (102, 114) in data writing and erasing operations, that the gate breakdown voltage and the reliability are considerably lowered.

In general, a polycrystalline silicon is used as the material of the first gate electrode and a polycrystalline silicon oxide layer is used as the material of the second gate insulation layer. The polycrystalline silicon oxide layer has a low gate breakdown voltage and an inferior reliability. Therefore, to increase withstand voltage and improve reliability, a relatively thick polycrystalline silicon oxide layer is used as the second gate insulation layer. However, when the second gate insulation layer is thick, a desired capacitance cannot be obtained. When the capacitance of the second gate insulation layer is insufficient, considerable writing time is required, which increases operation cost. Further, since the transistor current is also insufficient, the operation speed cannot be increased satisfactorily. These problems are serious particularly in the structure shown in FIGS. 1A to 1C, since it has only a small coupling area.

SUMMARY OF THE INVENTION

An object of the present invention is to provide a semiconductor device having a miniaturized memory cell with a sufficient capacitance, so that a high integration density and a high speed operation can be achieved, and to provide a method for manufacturing the same.

According to an aspect of the present invention, there is provided a semiconductor device comprising: a semiconductor substrate; first and second impurity regions, formed in the semiconductor substrate and extending in a first direction, which serve as bit lines; a first gate insulation layer formed on a channel region interposed between the first and second impurity regions; a first gate electrode formed on the first gate insulation layer; two isolation layers formed on the first and second impurity regions; a second gate insulation layer formed on the first gate electrode; and a second gate electrode, formed on the second gate insulation layer and extending in a second direction perpendicular to the first direction, which serves as a word line, the first gate electrode comprising: a first conductive layer; second conductive layers formed above the first conductive layer; and a thin film, formed between the first and second conductive layers, serving as a stopper when the second conductive layers are formed by etching, in which each of the second conductive layers consists of side walls formed along opposed sides of adjacent isolation layers.

According to another aspect of the present invention, there is provided a semiconductor device comprising: a semiconductor substrate; first and second impurity regions, formed in the semiconductor substrate and extending in a first direction, which serve as bit lines; a first gate insulation layer formed on a channel region interposed between the first and second impurity regions; a first gate electrode formed on the first gate insulation layer; two isolation layers formed on the first and second impurity regions; a second gate insulation layer formed on the first gate electrode; and a second gate electrode, formed on the second gate insulation layer and extending in a second direction perpendicular to the first direction, which serves as a word line, the first gate electrode comprising: a first conductive layer; second conductive layers formed above the first conductive layer; and a thin film, formed between the first and second conductive layers, serving as a stopper when the second conductive layers are formed by etching, in which each of the second conductive layers is formed along one of the adjacent isolation layers.

According to still another aspect of the present invention, there is provided a method for manufacturing a semiconductor device, comprising the steps of: forming a first gate insulation layer on a semiconductor substrate; forming a first conductive layer on the first gate insulation layer; forming an etching stopper thin film on the first conductive layer; forming a second conductive layer on the etching stopper thin film; selectively etching the etching stopper thin film and the first and second conductive layers using, as a mask, a resist pattern formed on a first gate electrode forming region on the second conductive layer; removing the resist pattern and forming isolation layers on previously etched region; subjecting the second conductive layer to anisotropic etching so that the second conductive layer remains along sides of the isolation layers, thereby forming a first gate electrode composed of a portion of the second conductive layer which remains on opposing sides of the isolation layers; forming a second gate insulation layer on the first gate electrode and the isolation layers; and forming a second gate electrode on the second gate insulation layer.

According to a further aspect of the present invention, there is provided a method for manufacturing a semiconductor device, comprising the steps of: forming a first gate insulation layer on a semiconductor substrate; forming a first conductive layer on the first gate insulation layer; forming an etching stopper thin film on the first conductive layer; forming a second conductive layer on the etching stopper thin film; selectively etching the etching stopper thin film and the first and second conductive layers using, as a mask, a first resist pattern formed on a first gate electrode forming region on the second conductive layer; removing the first resist pattern and forming isolation layers on previously etched region; etching the second conductive layer using, as a mask, a second resist pattern which covers part of the isolation layers and part of the second conductive layer adjacent thereto, so that the etching stopper thin film remains, and forming a first gate electrode composed of a portion of the second conductive layer which remains on a side of one of the isolation layers; removing the second resist pattern; forming a second gate insulation layer on the first gate electrode and the isolation layers; and forming a second gate electrode on the second gate insulation layer.

The semiconductor device of the present invention comprises a first gate electrode (floating gate electrode) having sidewall layers which abut on the adjacent isolation layers or having a stepped portion. With this structure, the coupling area interposed between the first and the second gate electrodes can be increased, thereby sufficiently increasing the capacitance.

According to the method of the present invention, to form a first gate electrode, a first conductive layer is first formed and then an etching stopper thin film is formed thereon. Thereafter, a second conductive layer is formed on the etching stopper thin film. Part of the second conductive layer is processed by anisotropic etching so that the etching stopper thin film remains. Thus, the surface of the first gate electrode is constituted by the surface of the etching stopper thin film and that portion of the surface of the second conductive layer which is contiguous to the surface of the etching stopper thin film. Therefore, the coupling area can be increased.

Further, the surface area of the first gate electrode formed by the anisotropic etching can be easily controlled by changing the thickness of the second conductive layer. Therefore, a desired capacitance can be easily obtained.

Moreover, in the semiconductor device of the present invention, since the bit line and the floating gate electrode are formed in a self-aligning manner, it is possible to form a fine memory cell.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described in detail with reference to the accompanying drawings.

Example 1

Figure 2A:
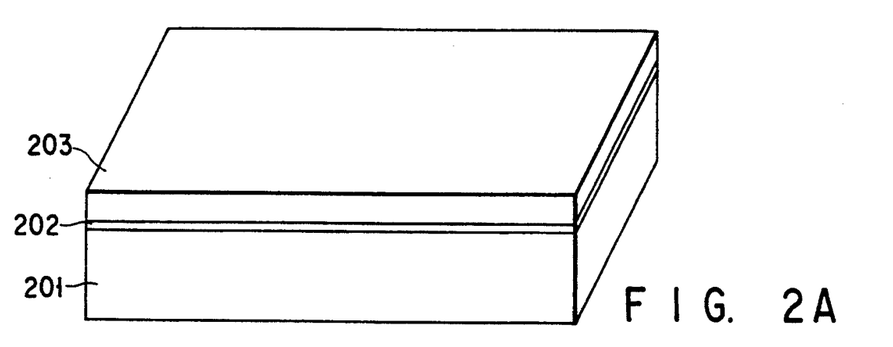
FIGS. 2A to 2H are diagrams showing the steps of manufacturing a semiconductor device according to a first embodiment of the present invention.

FIGS. 2A to 2H are perspective views showing the steps of manufacturing an N-channel MOS EPROM cell transistor according to a first embodiment of the present invention. First, as shown in FIG. 2A, a first gate oxide layer 202 having a thickness of 20 nm is formed on a P-type Si substrate 201 by thermal oxidation. Then, after boron, as an impurity to control the threshold voltage, is ion-implanted into the substrate 201, a first polycrystalline silicon layer 203 having a thickness of 200 nm is formed on the first gate oxide layer 202 by an LPCVD method.

Figure 2B:
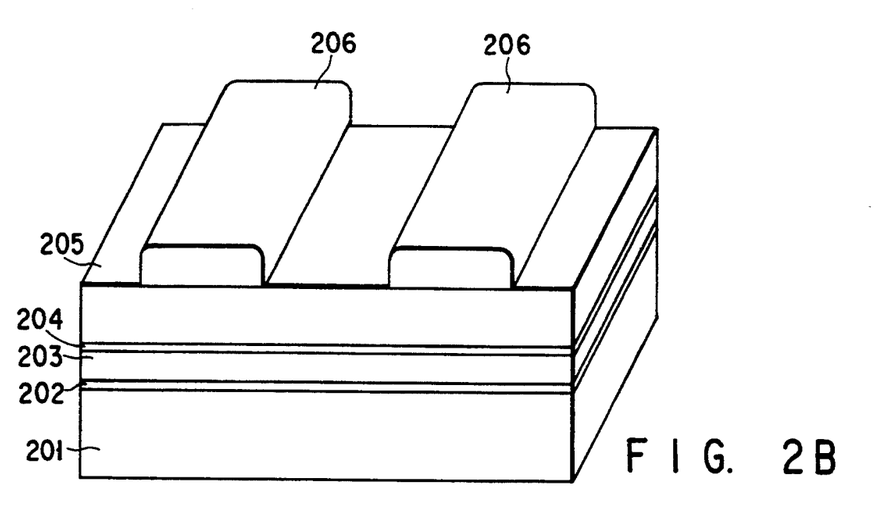

Thereafter, as shown in FIG. 2B, the surface of the first polycrystalline silicon layer 203 is oxidized by thermal oxidation, thereby forming an etching stopper thin film 204 having a thickness of 4 nm.

An oxide film formed through natural oxidation can be used as the etching stopper thin film. It is preferable that the thickness of the etching stopper thin film 204 be 2 to 7 nm. When the thickness is less than 2 nm, the thin film hardly serves as an etching stopper, and when the thickness exceeds 7 nm, it is difficult to cause dielectric breakdown in a subsequent step. A refractory metal, which is conductive, can be used as the etching stopper thin film 204, instead of an oxide layer. Examples of refractory metal are W, Mo, Ti, Ta, Nb and the like. Further, an etching stopper thin film can be formed by slightly nitriding the surface of the polycrystalline silicon layer 203.

A second polycrystalline silicon layer 205 having a thickness of 200 nm is formed on the etching stopper thin film 204 by the LPCVD method. The conditions of the LPCVD method are the same as those in forming the first polycrystalline silicon layer 203. A coupling surface area of a first gate electrode (floating gate electrode), which is to be formed later, can be controlled by changing the thickness of the second polycrystalline silicon layer 205. For example, it is preferable that the thickness of the second polycrystalline silicon layer 205 be at least 50 nm, in a case where the thickness of the first polycrystalline silicon layer 203 is 200 nm. If the thickness of the polycrystalline silicon layer 205 is 50 nm or greater, a sufficient coupling surface area can be obtained.

Further, a resist pattern 206 is formed by lithography in a floating gate electrode (first gate electrode) forming region on the second polycrystalline silicon layer 205.

Figure 2C:
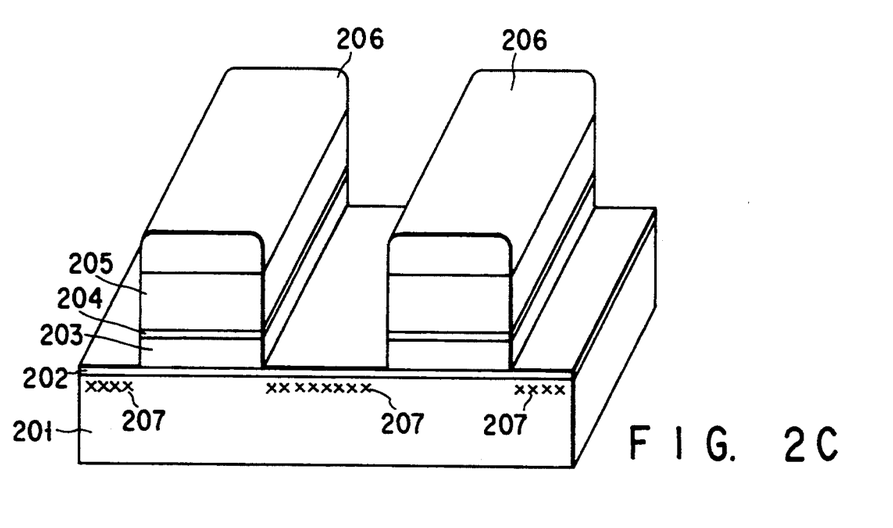

Subsequently, as shown in FIG. 2C, the second polycrystalline silicon layer 205, the etching stopper thin film 204 and the first polycrystalline silicon layer 203 are etched by RIE using the resist pattern 206 as a mask. Then, an impurity is diffused into an exposed portion of the silicon substrate 201 through the first gate oxide layer 202, using the resist pattern 206 as a mask, thereby forming a defect region 207. For example, arsenic ion can be ion-implanted as an impurity at an accelerating voltage of 40 KeV in a dose of $5 \times 10^{15}$/cm.

Figure 2D:
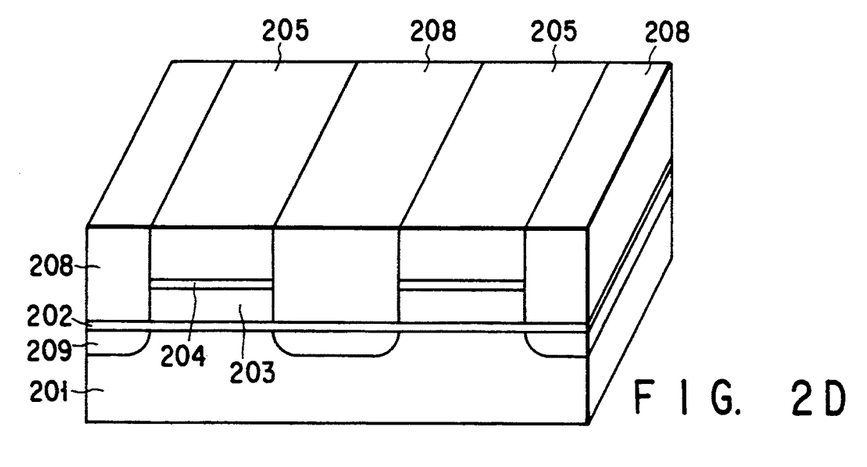

The resist pattern 206 is removed, and thereafter an $SiO_2$ layer is deposited by a CVD method and etched back. Thus, an $SiO_2$ layer 208 is buried in a previously etched region. This state is shown in FIG. 2D. The buried $SiO_2$ layer 208 serves as an isolation oxide layer. The defect region 207 is activated to be an n+ wiring layer 209.

Figure 2E:
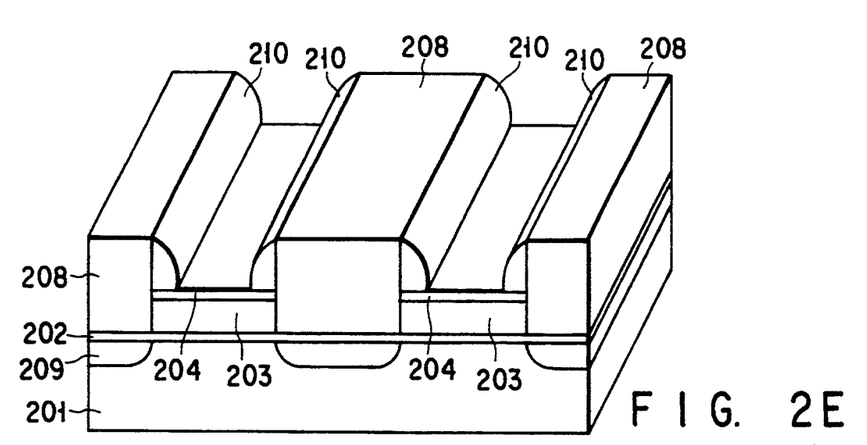

Then, the second polycrystalline silicon layer 205 is etched by RIE. As a result, part of the second polycrystalline silicon layer remains as a sidewall layer 210. During the etching process, since the etching stopper thin film 204 is not etched, only the layer above the etching stopper thin film 204 is processed, the layer thereunder being maintained in an originally formed state. After the layer above the etching stopper thin film 204 have been processed to form a desired configuration, they constitute a first gate electrode along with the layer thereunder. The etching can be performed by a method other than the RIE. For example, it is possible to employ an anisotropic etching method by which the etching stopper thin film 204 is not etched and the selectivity ratio of polycrystalline silicon to $SiO_2$ is high.

The width of the sidewall layer 210 can be determined in accordance with the thickness of the second polycrystalline silicon layer 205, although the minimum thickness is limited to a value to allow the second polycrystalline silicon layer to remain as a sidewall layer, even after it is oxidized in a step of forming a second gate insulation layer (to be described later).

Figure 2F:
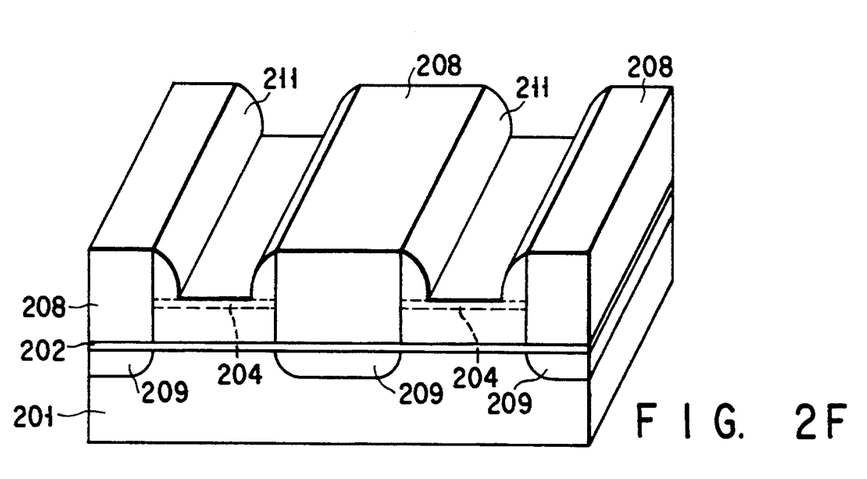

Further, P is doped into the sidewall layer 210 (a portion of the second polycrystalline silicon layer) and the first polycrystalline silicon layer 203 by a POCl$_3$ method, thereby dielectrically breaking down the etching stopper thin film 204 interposed between the two polycrystalline silicon layers. As a result, the sidewall layer 210 and the first polycrystalline silicon layer 203 are electrically connected. In this manner, a floating gate electrode 211 as shown in FIG. 2F is formed. The above-mentioned dielectric breakdown can be performed by ion-implanting an impurity other than P, e.g., As or Sb. If a refractory metal such as Ti is used as the etching stopper thin film 204, dielectric breakdown is unnecessary, since the metal is conductive.

It is possible to etch back the isolation oxide layer 208 so as to expose part of the side of the floating gate electrode 211 which abuts on the isolation oxide layer 208, thereby increasing the surface area of the floating gate electrode 211.

Then, the surface of the floating gate electrode 211 is oxidized by thermal oxidation, thereby forming a silicon oxide layer 212. Further, a silicon nitride layer 213 is formed on the oxide layer 212 by an LPCVD method. The surface of the silicon nitride layer 213 is oxidized by thermal oxidation again, thereby forming a silicon oxide layer 214.

The silicon oxide layer 212, the silicon nitride layer 213 and the silicon oxide layer 214 constitute a second gate insulation layer 215.

Figure 2G:
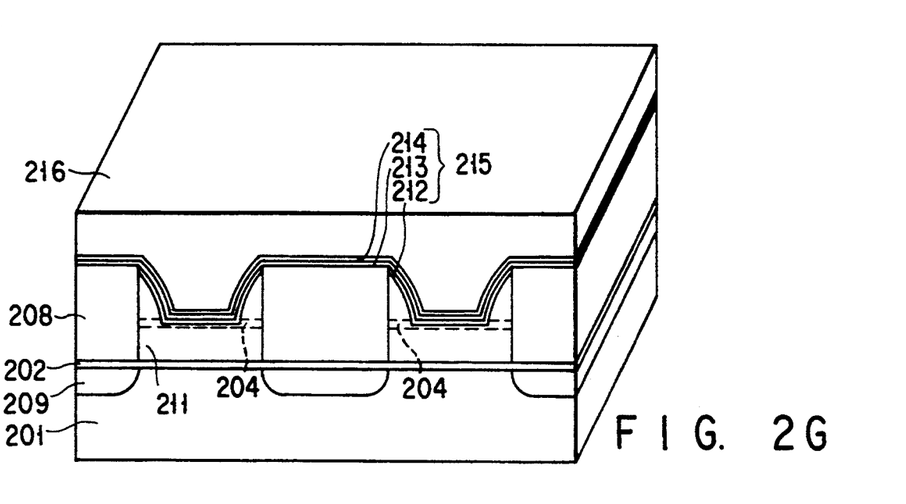

Subsequently, a third polycrystalline silicon layer is deposited on the second gate insulation layer 215 by a CVD method. The third polycrystalline silicon layer is doped with P and then patterned, thereby forming a second gate electrode (control gate electrode) 216 as shown in FIG. 2G. Thus, an N-channel MOS EPROM cell transistor 217 as shown in FIG. 2H is obtained.

Figure 2H:
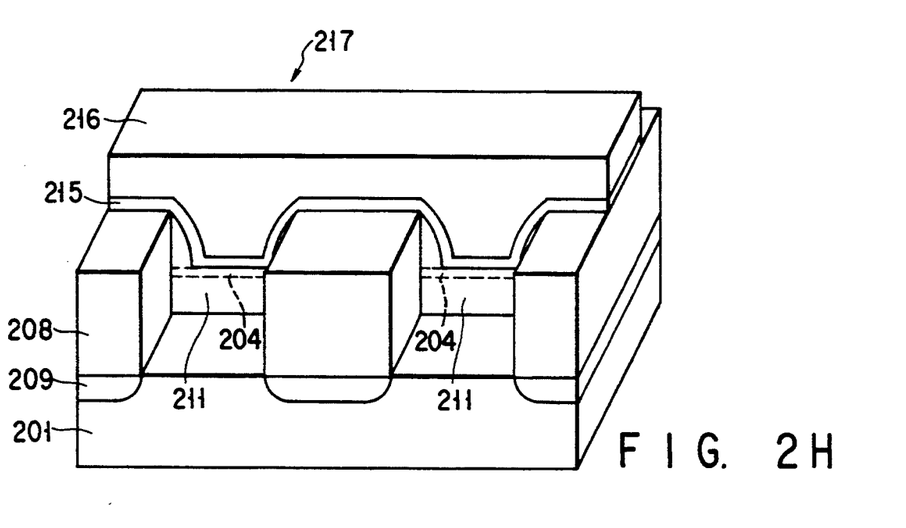
Figure 3:
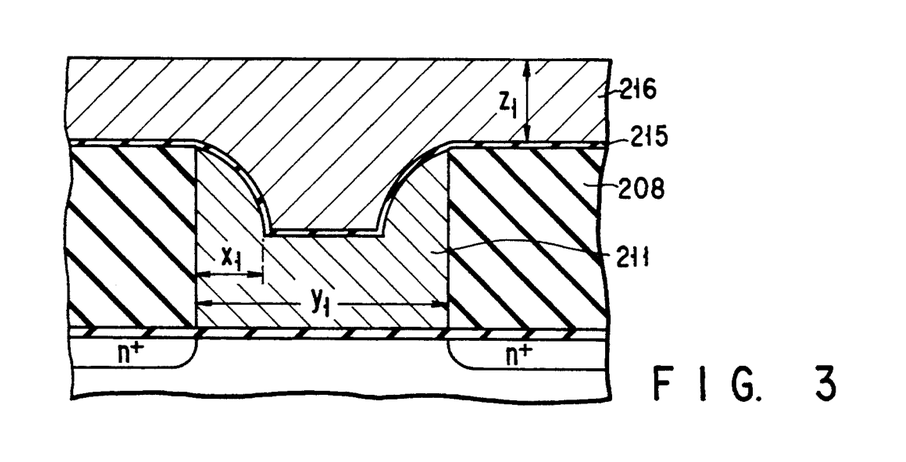
FIG. 3 is a cross-sectional view showing part of a semiconductor device according to the first embodiment of the present invention.

In the semiconductor device (transistor) 217 of this embodiment, the control gate electrode 216 made of polycrystalline silicon is formed on the floating gate electrode 211 with the interlayer insulation layer (second gate insulation layer) 215 interposed therebetween, as shown in FIG. 2H. FIG. 3 shows an enlarged cross-sectional view of the semiconductor device 217. It is desirable that the surface of the control gate electrode 216 be planarized. In this case, the maximum width of the sidewall ($x_l$), the maximum width of the first gate electrode ($y_l$), the thickness of a portion of the second gate electrode above the isolation layer ($z_1$) have a relationship as indicated by the following formula (1):

$(y_1 - 2x_1)/2 < z_1$ $x_1$: the maximum width of the sidewall,
$y_1$: the maximum width of the first gate electrode,
$z_1$: the thickness of a portion of the second gate electrode above the isolation layer.

When the formula (1) is not satisfied, the sidewall layer is so thin that it is difficult to planarize the surface of the second gate electrode 216.

Further, a refractory metal silicide layer may be formed on the control gate electrode 216 by a sputtering method. Examples of refractory metal are W, Mo, Ti, Ta and Nb. By virtue of the refractory metal silicide layer, the resistance of the control gate is lowered, thereby increasing the reading operation.

When the thickness of the control gate is 150 nm, the silicide layer may be 200 nm thick.

Refractory metal silicide, particularly WSi, is disadvantageous in that it tends to be discontinuous at a grooved portion. Therefore, it is preferable that a silicide layer be formed after the second gate electrode has been formed in the conditions as represented by the formula (1).

Example 2

FIGS. 4A to 4D are perspective views showing the steps of manufacturing an N-channel MOS EPROM cell transistor according to a second embodiment of the present invention.

Figure 4A:
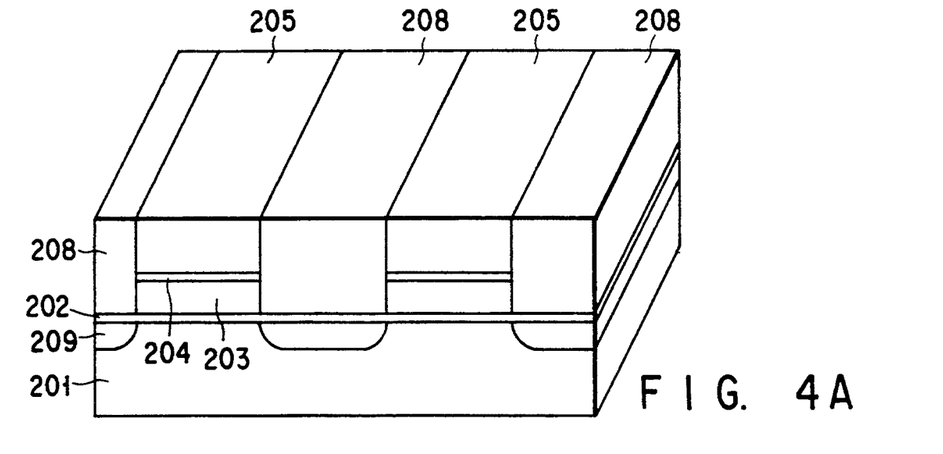
FIGS. 4A to 4D are diagrams showing the steps of manufacturing a semiconductor device according to a second embodiment of the present invention.

First, a structure shown in FIG. 4A is formed through the same steps as shown in FIGS. 2A to 2C of Example 1. More specifically, an oxide layer 202 having a thickness of 20 nm is formed on a p-type silicon substrate 201. A first polycrystalline silicon layer 203 is deposited to a thickness of 200 nm on the oxide layer 202. An oxide layer 204 having a thickness of 4 nm is formed on the first polycrystalline silicon layer 203. The oxide layer 204 serves as an etching stopper. A second polycrystalline silicon layer 205 is deposited to a thickness of 200 nm. The method and the conditions for forming the layers are the same as those in Example 1. The substrate having these layers is subjected to an etching process using the resist pattern 206 as a mask. Then, arsenic ions are implanted. Further, an isolation oxide SiO$_2$ layer 208 is buries, and an n+wiring layer 209 is formed.

Figure 4B:
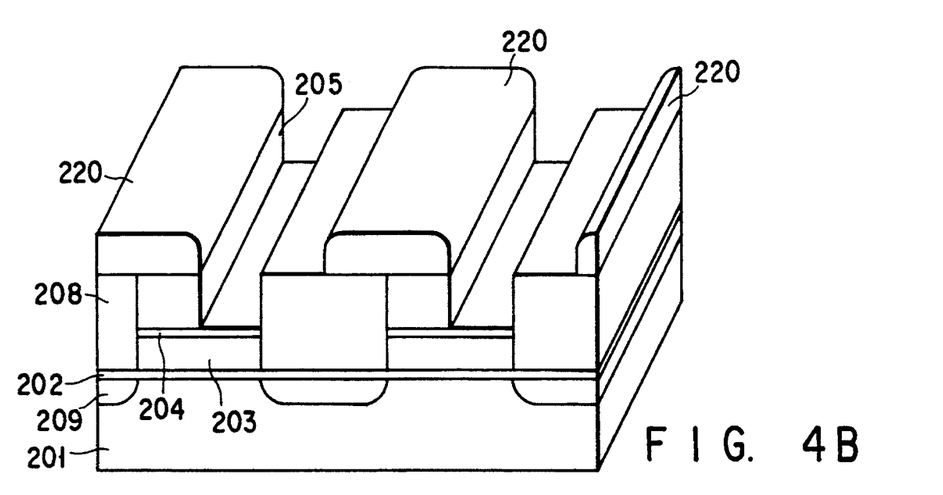

Thereafter, a resist pattern 220 is formed so as to cover part of the isolation oxide SiO$_2$ layer 208 and part of the second polycrystalline silicon layer 205 which abuts on one side of the isolation oxide layers 208. The second polycrystalline silicon layer 205 is etched so as to expose the etching stopper thin film 204 by RIE using the resist pattern 220 as a mask. The resultant structure is shown in FIG. 4B.

Figure 4C:
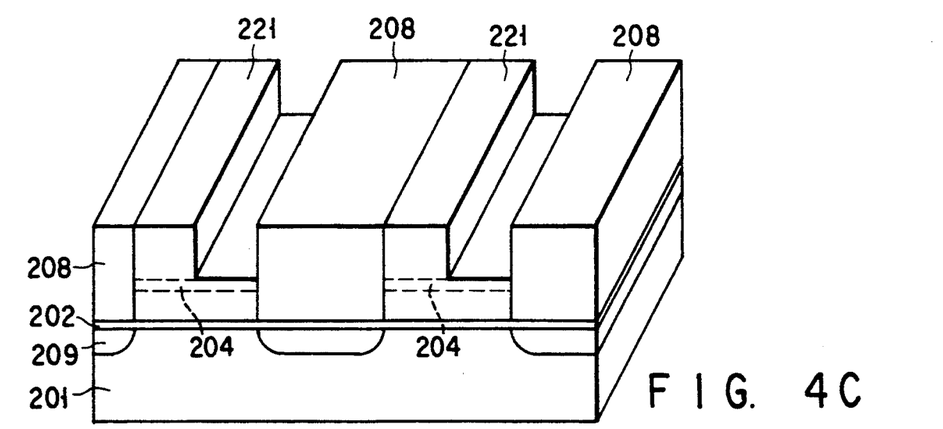

Subsequently, the resist pattern 220 is removed, and then P is doped into the remaining second polycrystalline silicon layer 205 and the first polycrystalline silicon layer 203 by a POCl$_3$ method. As a result, the etching stopper thin film 204 interposed between the polycrystalline silicon layers is dielectrically broken down. Consequently, the second polycrystalline silicon layer 205 is electrically connected to the first polycrystalline silicon layer 203, thereby forming a first gate electrode (floating gate electrode) 221 having a stepped portion as shown in FIG. 4C. As in Example 1, the dielectric breakdown can be performed by ion-implanting an impurity other than P, and if a refractory metal such as Ti is used as the etching stopper thin film 204, dielectric breakdown is unnecessary.

It is preferable that the isolation oxide layer 208 be etched back so as to expose part of the side of the floating gate electrode 221 which abuts on the isolation oxide layer 208, since the surface area of the floating gate electrode 221 is increased.

Then, the surface of the floating gate electrode 221 is oxidized by thermal oxidation, thereby forming a silicon oxide layer (second gate insulation layer) 222. A composite layer formed of SiO$_2$/Si$_x$N$_y$/SiO$_2$ may be used as the second gate insulation layer, as in Example 1, where the values of x and y are 3 and 4 in theory, but are not exactly 3 and 4 is practice.

Subsequently, a third polycrystalline silicon layer is deposited on the second gate oxide layer 222 by a CVD method. The third polycrystalline silicon layer is doped with P and then patterned, thereby forming a second gate electrode (control gate electrode) 223. Thus, an N-channel MOS EPROM cell transistor 224 as shown in FIG. 4D is obtained.

Figure 4D:
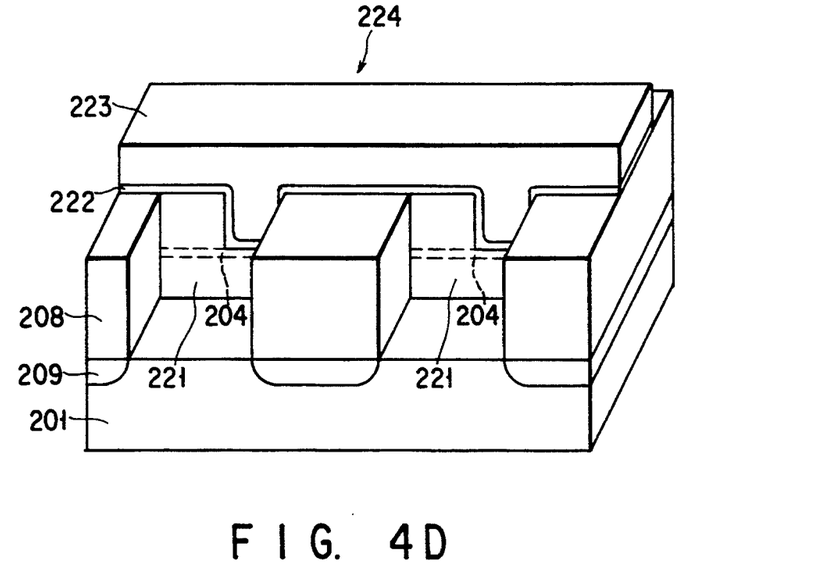
Figure 5:
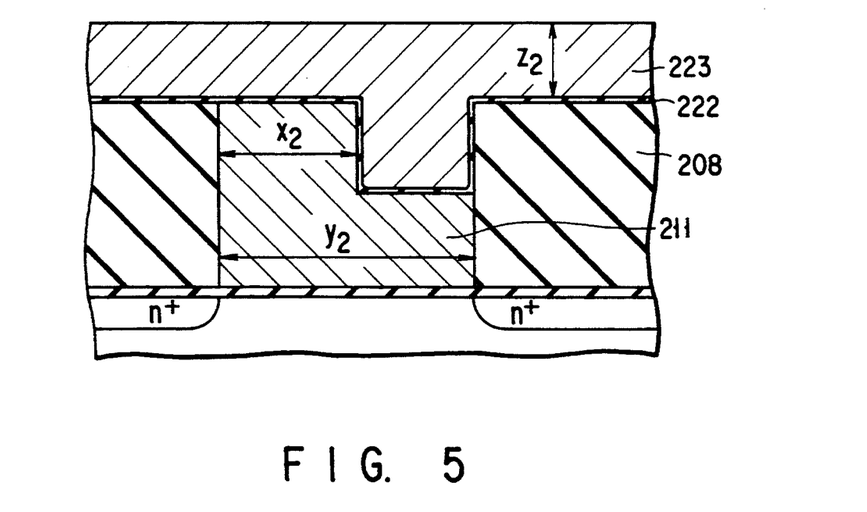
FIG. 5 is a cross-sectional view showing part of a semiconductor device according to the second embodiment of the present invention.

In the semiconductor device (transistor) 224 of this embodiment, the second gate electrode 223 made of polycrystalline silicon is formed on the floating gate electrode 221 with the interlayer insulation layer (second gate insulation layer) 222 interposed therebetween, as shown in FIG. 4D. FIG. 5 shows an enlarged cross-sectional view of the semiconductor device 224. It is desirable that the surface of the control gate electrode 223 be planarized as in Example 1. In this case, the minimum width of the first gate electrode ($x_2$), the maximum width of the first gate electrode ($y_2$), the thickness of a portion of the second gate electrode above the isolating layer ($z_2$) have a relationship as indicated by the following formula (2):

$y_2 - 2z_2 < x_2$ $x_2$: the minimum width of the first gate electrode
$y_2$: the maximum width of the first gate electrode
$z_2$: the thickness of a portion of second gate electrode above the isolation layer.

When the formula (2) is not satisfied, the minimum width of the first gate electrode, which has been etched, is so small that it is difficult to planarize the surface of the second gate electrode 223.

Further, as in Example 1, a refractory metal silicide layer may be formed on the second gate electrode 223. Examples of refractory metal are W, Mo, Ti, Ta and Nb.

By virtue of the refractory metal silicide layer, the resistance of the control gate is lowered, thereby increasing the reading operation. It is particularly preferable that the silicide layer is formed after the second gate electrode has been formed under the conditions indicated by the formula (2), so that the silicide film is prevented from being discontinuous.

In manufacturing a semiconductor device of this embodiment, precise lithography which may increase the manufacturing cost is not required when the second polycrystalline silicon layer is etched. More specifically, the resist pattern 220 shown in FIG. 4B is used as a mask in an etching process for removing part of the second polycrystalline silicon layer 205. This etching process is to increase the area determined by the thickness of the second polycrystalline silicon layer 205. Therefore, even if mask misalignment occurs or the thickness of the resist pattern varies, the area of the side of the second polycrystalline silicon layer 205 does not vary. In other words, the coupling area of the floating gate electrode 221 does not vary.

As has been described above, in Example 1, it is possible to use a relatively thick thermal oxide layer, which has been obtained by oxidizing polycrystalline silicon, as the second gate insulation layer. According to the conventional art, a relatively thick thermal oxide layer is not preferable as a second gate insulation layer, since it reduces the capacitance. However, according to the present invention, the reduction of the capacitance can be compensated by increasing the coupling area.

Further, in Example 2, it is possible to use a relatively coarse and thick polycrystalline silicon oxide layer, which has been formed by a thermal process at a temperature of 800° C. or lower, as the second gate insulation layer. According to the conventional art, such a relatively thick thermal oxide layer formed of polycrystalline silicon is not preferable as a second gate insulation layer. Therefore, a high-quality thin thermal oxide layer formed by a thermal process at a temperature of 1000° C. or higher has been generally used as a second gate insulation layer. According to the present invention, a relatively coarse and thick oxide layer can be used for the same reason as stated above relating to Example 1.

Thus, in the semiconductor device formed by the method according to the embodiments of the present invention, a desired capacitance can be obtained by increasing the coupling area. As a result, the drawbacks of the conventional art can be overcome. In addition, when the second gate insulation layer is formed in the manner as described above, the manufacturing cost is reduced. In Example 2 in particular, the number of the heating steps is reduced, thereby suppressing the diffusion of the impurity to a minimum degree, so that the cell can be sufficiently miniaturized.

As detailed above, according to the present invention, since the interface between the first gate electrode (floating gate electrode) and the second insulation layer is not flat, the coupling area can be increased, thereby ensuring a desired capacitance with easy control. Further, if the above structure has no bit line contact, a miniaturized memory cell can be manufactured. Thus, the data write time is reduced, and simultaneously, the channel current is greatly increased. Hence, the inspection time is considerably reduced, resulting in cost reduction, a high performance and a high speed operation.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    first and second impurity regions, formed in the semiconductor substrate and extending in a first direction, which serve as bit lines;
    a first gate insulation layer formed on a channel region interposed between the first and second impurity regions;
    a first gate electrode formed on the first gate insulation layer;
    two isolation layers formed on the first and second impurity regions;
    a second gate insulation layer formed on the first gate electrode; and
    a second gate electrode, formed on the second gate insulation layer and extending in a second direction perpendicular to the first direction, which serves as a word line,
    the first gate electrode comprising:
    a first conductive layer;
    two second conductive layers formed above the first conductive layer; and
    a thin film, formed between the first and second conductive layers, serving as a stopper when the second conductive layers are formed by etching,
    in which each of the second conductive layers consists of side wall layers formed along opposed sides of adjacent isolation layers.

2. A semiconductor device according to claim 1, wherein the etching stopper thin film is formed of a non-conductive material and caused to be conductive by doping an impurity.

3. A semiconductor device according to claim 2, wherein the impurity is selected from a group consisting of P, As and Sb.

4. A semiconductor device according to claim 1, wherein the etching stopper thin film is formed of a non-conductive material and caused to be conductive by ion-implanting an impurity.

5. A semiconductor device according to claim 4, wherein the impurity is selected from a group consisting of P, As and Sb.

6. A semiconductor device according to claim 1, wherein the etching stopper thin film is formed of a refractory metal.

7. A semiconductor device according to claim 1, further comprising a refractory metal silicide layer formed on the second gate electrode.

8. A semiconductor device according to claim 7, wherein the refractory metal silicide is selected from a group consisting of WSi, MoSi, TiSi, TaSi and NbSi.

9. A semiconductor device according to claim 1, wherein the following formula (1) is satisfied:

$$(y_1 - 2x_1)/2 < z_1 \tag{1}$$

where $x_1$: a maximum thickness of a sidewall,
$y_1$: a maximum width of the first gate electrode, and
$z_1$: a thickness of a portion of the second gate electrode above the isolation layer.

10. A semiconductor device according to claim 9, further comprising a refractory metal silicide layer formed on the second gate electrode.

11. A semiconductor device according to claim 10, wherein the refractory metal silicide is selected from a group consisting of WSi, MoSi, TiSi, TaSi and NbSi.

12. A semiconductor device comprising:
a semiconductor substrate;
first and second impurity regions, formed in the semiconductor substrate and extending in a first direction, which serve as bit lines;
a first gate insulation layer formed on a channel region interposed between the first and second impurity regions;
a first gate electrode formed on the first gate insulation layer;
two isolation layers formed on the first and second impurity regions;
a second gate insulation layer formed on the first gate electrode; and
a second gate electrode, formed on the second gate insulation layer and extending in a second direction perpendicular to the first direction, which serves as a word line,
the first gate electrode comprising:
a first conductive layer;
a second conductive layer formed above the first conductive layer; and
a thin film, formed between the first and second conductive layers, serving as a stopper when the second conductive layers are formed by etching,
in which each of the second conductive layers is formed along one of opposed side of adjacent isolation layers.

13. A semiconductor device according to claim 12, wherein the etching stopper thin film is formed of a non-conductive material and caused to be conductive by doping an impurity.

14. A semiconductor device according to claim 13, wherein the impurity is selected from a group consisting of P, As and Sb.

15. A semiconductor device according to claim 12, wherein the etching stopper thin film is formed of a non-conductive material and caused to be conductive by ion-implanting an impurity.

16. A semiconductor device according to claim 15, wherein the impurity is selected from a group consisting of P, As and Sb.

17. A semiconductor device according to claim 12, wherein the etching stopper thin film is formed of a refractory metal.

18. A semiconductor device according to claim 12, further comprising a refractory metal silicide layer formed on the second gate electrode.

19. A semiconductor device according to claim 18, wherein the refractory metal silicide is selected from a group consisting of WSi, MoSi, TiSi, TaSi and NbSi.

20. A semiconductor device according to claim 12, wherein the following formula (2) is satisfied:

$$y_2 - 2z_2 < x_2 \tag{2}$$

where $x_2$: a minimum width of the first gate electrode,
$y_2$: a maximum width of the first gate electrode, and
$z_2$: a thickness of a portion of the second gate electrode above the isolation layer.

21. A semiconductor device according to claim 20, further comprising a refractory metal silicide layer formed on the second gate electrode.

22. A semiconductor device according to claim 21, wherein the refractory metal silicide is selected from a group consisting of WSi, MoSi, TiSi, TaSi and NbSi.

* * * * *